United States Patent
Ji

(10) Patent No.: US 8,664,997 B2
(45) Date of Patent: Mar. 4, 2014

(54) RAPID SWITCHABLE HV P-MOS POWER TRANSISTOR DRIVER WITH CONSTANT GATE-SOURCE CONTROL VOLTAGE

(75) Inventor: Cang Ji, Kirchheim/Teck (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 194 days.

(21) Appl. No.: 12/932,994

(22) Filed: Mar. 11, 2011

(65) Prior Publication Data

US 2012/0229173 A1   Sep. 13, 2012

(30) Foreign Application Priority Data

Mar. 7, 2011 (EP) .................................. 11368005

(51) Int. Cl.
 *H03L 5/00* (2006.01)
(52) U.S. Cl.
 USPC .............................. 327/333; 326/81; 327/108
(58) Field of Classification Search
 USPC ............ 327/170, 333, 374, 376, 377; 326/80, 326/81
 See application file for complete search history.

(56) References Cited

U.S. PATENT DOCUMENTS

| | | | |
|---|---|---|---|
| 4,937,477 A | 6/1990 | Tsoi et al. | |
| 5,325,258 A | 6/1994 | Choi et al. | |
| 5,545,972 A * | 8/1996 | Kiehl | 323/315 |
| 5,629,614 A * | 5/1997 | Choe et al. | 323/315 |
| 6,057,726 A * | 5/2000 | Sumida | 327/333 |
| 6,078,204 A | 6/2000 | Cooper et al. | |
| 6,194,920 B1 * | 2/2001 | Oguri | 327/65 |
| 6,380,793 B1 * | 4/2002 | Bancal et al. | 327/427 |
| 6,459,326 B2 * | 10/2002 | Descombes | 327/513 |
| 6,507,226 B2 | 1/2003 | Swonger et al. | |
| 6,600,304 B2 * | 7/2003 | Kim | 323/315 |
| 6,977,523 B2 * | 12/2005 | Tamaki | 326/68 |
| 7,154,733 B2 * | 12/2006 | Sibrai | 361/248 |
| 7,180,140 B1 * | 2/2007 | Brisbin et al. | 257/361 |
| 7,235,451 B2 * | 6/2007 | Hao et al. | 438/306 |
| 7,388,387 B2 * | 6/2008 | Bordelon, Jr. | 324/713 |
| 7,489,181 B2 * | 2/2009 | Pastorina et al. | 327/530 |
| 7,560,972 B1 * | 7/2009 | Tiew et al. | 327/333 |
| 7,679,420 B1 * | 3/2010 | Burkland et al. | 327/333 |
| 8,085,078 B2 * | 12/2011 | Honda | 327/333 |
| 8,125,808 B2 * | 2/2012 | Sells | 363/127 |
| 8,410,839 B2 * | 4/2013 | Larsen et al. | 327/309 |
| 2005/0258876 A1 * | 11/2005 | Dake et al. | 327/108 |
| 2006/0186943 A1 * | 8/2006 | Ku et al. | 327/333 |
| 2007/0273428 A1 * | 11/2007 | Theiler | 327/436 |
| 2009/0085639 A1 * | 4/2009 | Ueno | 327/333 |
| 2013/0038355 A1 * | 2/2013 | Heo | 327/109 |

OTHER PUBLICATIONS

European Search Report 11368019.3-1233 Mail date—Jun. 4, 2012.
"Low-Power Static and Dynamic High-Voltge CMOS Level-Shifter Circuits," by Khorasani et al., IEEE International Symposium on Circuits and Systems, May 18, 2008, pp. 1946-1949.

* cited by examiner

*Primary Examiner* — Thomas J Hiltunen
(74) *Attorney, Agent, or Firm* — Saile Ackerman LLC; Stephen B. Ackerman

(57) ABSTRACT

Systems and methods for providing a rapid switchable high voltage power transistor driver with a constant gate-source control voltage have been disclosed. A low voltage control stage keeps the gate-source voltage constant in spite of temperature and process variations. A high voltage supply voltage can vary between about 5.5 Volts and about 40 Volts. The circuit allows a high switching frequency of e.g. 1 MHz and minimizes static power dissipation.

41 Claims, 6 Drawing Sheets

RAPID SWITCHABLE HV P-MOS POWER TRANSISTOR DRIVER WITH CONSTANT GATE-SOURCE CONTROL VOLTAGE

BACKGROUND (1) Field of the Invention

This invention relates generally to transistor drivers and relates more specifically to a driver for a high voltage P-MOS power transistor having accurate control voltage and faster switching.

(2) Description of the Prior Art

For applications as e.g. automotive applications supply voltages up to 40 Volts and even higher are often required. High-Voltage CMOS devices are usually based on a 5V technology with an extended drain region to reach up to e.g. 40V drain-source breakdown capability. As the source side of the High-Voltage CMOS devices is the same as it is for 5-V CMOS devices, its bulk-source voltage, Vbs, as well as its gate-source voltage, Vgs, are limited to 5V. Static power dissipation of the high voltage (HV) transistors, achieving accurate control voltage of e.g. 5 Volts and high switching speed are key problems with high voltage CMOS devices, which should be overcome.

It is a challenge for engineers designing driver circuits for high voltage applications, i.e. supply voltages in the order of magnitude of 40 V to overcome above problems.

(U.S. Pat. No. 6,507,226 to Swonger et al.) discloses a circuit and method translating a logic level input signal to signals at high voltage levels to drive a power device, such as a power MOSFET, while minimizing the power consumption. The circuit for driving the power device includes a low side gate driver, and a high side gate driver adjacent thereto. The high side gate drive includes a high side gate driver logic input, a high side gate driver output, a latch connected between the high side gate driver logic input and the high side gate driver output, and a control circuit receiving an output of the latch and controlling signals from the high side gate driver logic input to the latch based upon the output of the latch.

(U.S. Pat. No. 5,325,258 to Choi et al.) discloses a circuit and method for driving a power transistor device. The circuit for driving a power transistor device has a driver having an input and an output, the output coupled to a control input of the power transistor device and the input coupled to a primary control voltage source for driving the power transistor device. A current sensing device is coupled to the power transistor device for providing a signal proportional to the current in the power transistor device. An amplifier is coupled to the current sensing device for providing a substantially linear control signal proportional to the current in the power transistor device, the linear control signal being provided to the input of the driver as a secondary drive signal for driving the power transistor device when a current level in the power transistor device greater than a threshold level is detected. A detector is provided for detecting when the current in the power transistor device is greater than the threshold level. The detector is coupled to the current sensing device and to a reference level source, and provides an overcurrent signal to the driver for switching the driver from being driven by the primary control voltage source to the secondary drive signal. The secondary drive signal drives the driver so as to reduce the current level in the power transistor device. The driven power transistor device is preferably a power MOSFET or IGBT.

(U.S. Pat. No. 4,937,477 to Tsoi et al.) proposes a high-voltage level translator circuit that is suitable for monolithic integration. The level translator circuit comprises serially connected current sources suitably ratioed so that the gating on of one current source causes a limited voltage rise across the other current source, which is ungated. The circuit is suitable for integration in a junction-isolated monolithic pseudo-complementary CMOS format.

SUMMARY

A principal object of the present invention is to achieve an accurate control voltage for a high voltage power transistor.

A further object of the invention is to establish an accurate control voltage independent of temperature and process variations.

A further object of the invention is to minimize static power dissipation of a high voltage power transistor.

Another object of the invention is to enhance switching speed of the high voltage power transistor.

In accordance with the objects of this invention a method to provide a fast switchable high voltage power transistor driver circuit has been achieved. The method invented comprises, firstly, the following steps: (1) providing a circuit comprising a port for a high voltage supply voltage, a port for a low voltage supply voltage, an input stage comprising a high voltage power transistor, an output port, and a port for a digital input signal, and a control stage to achieve a constant gate-source voltage of the high voltage power transistor, and (2) limiting the gate-source voltage of the high voltage power transistor using a voltage drop of a first reference current across a resistive load if the digital input signal is high. Furthermore the method invented comprises the steps: (3) pulling the gate of the high voltage power transistor to the level of the high voltage supply voltage if the digital input signal is low, and (4) generating a second reference current, which is controlled by a reference voltage via a differential amplifier, wherein the second reference current is mirrored to the first reference current in order to establish an accurate gate source voltage of the high voltage.

In accordance with the objects of this invention a fast switchable high voltage power transistor driver circuit has been achieved. The driver circuit invented comprises, firstly an input stage comprising: a port for a high voltage supply voltage, a port for a digital input signal, and a high voltage power transistor connected between said high voltage supply port and an output port of the circuit. Furthermore the input stage comprises a resistive load connected between a gate of the high voltage power transistor and the high voltage supply port, a high voltage transistor being connected between the gate of the high voltage power transistor and a low voltage transistor, and said low voltage transistor connected between the high voltage transistor and ground wherein the gate of the low voltage transistor is connected to a gate of a fourth transistor of a control stage. Furthermore the driver circuit comprises a control stage comprising: a port of a low voltage supply voltage, a differential amplifier having inputs and an output, wherein a first input is connected to a port of a reference voltage, a second input is a voltage of a first terminal of a first means of resistance, and the output is connected to a gate of a first transistor, and said means of resistance, wherein the first terminal is connected to the first transistor and a second terminal is connected to ground. Furthermore the control stage comprises said first transistor connected between said means of resistance and a second transistor, said second transistor connected between said first transistor and the port for low supply voltage, wherein the second transistor is forming a first current mirror with a third transistor, said third transistor connected between the port for the low voltage supply voltage and the fourth transistor, and said fourth transistor connected between the third transistor and ground, wherein the fourth transistor is forming a second current mirror with said low voltage transistor of the input stage.

BRIEF DESCRIPTION OF THE DRAWINGS

In the accompanying drawings forming a material part of this description, there is shown.

DESCRIPTION OF THE PREFERRED EMBODIMENTS

Methods and circuits to achieve an accurate control voltage of a high voltage power transistor combined with a rapid switching-on and switching-off operation of a high voltage power transistor are disclosed.

Figure 1:
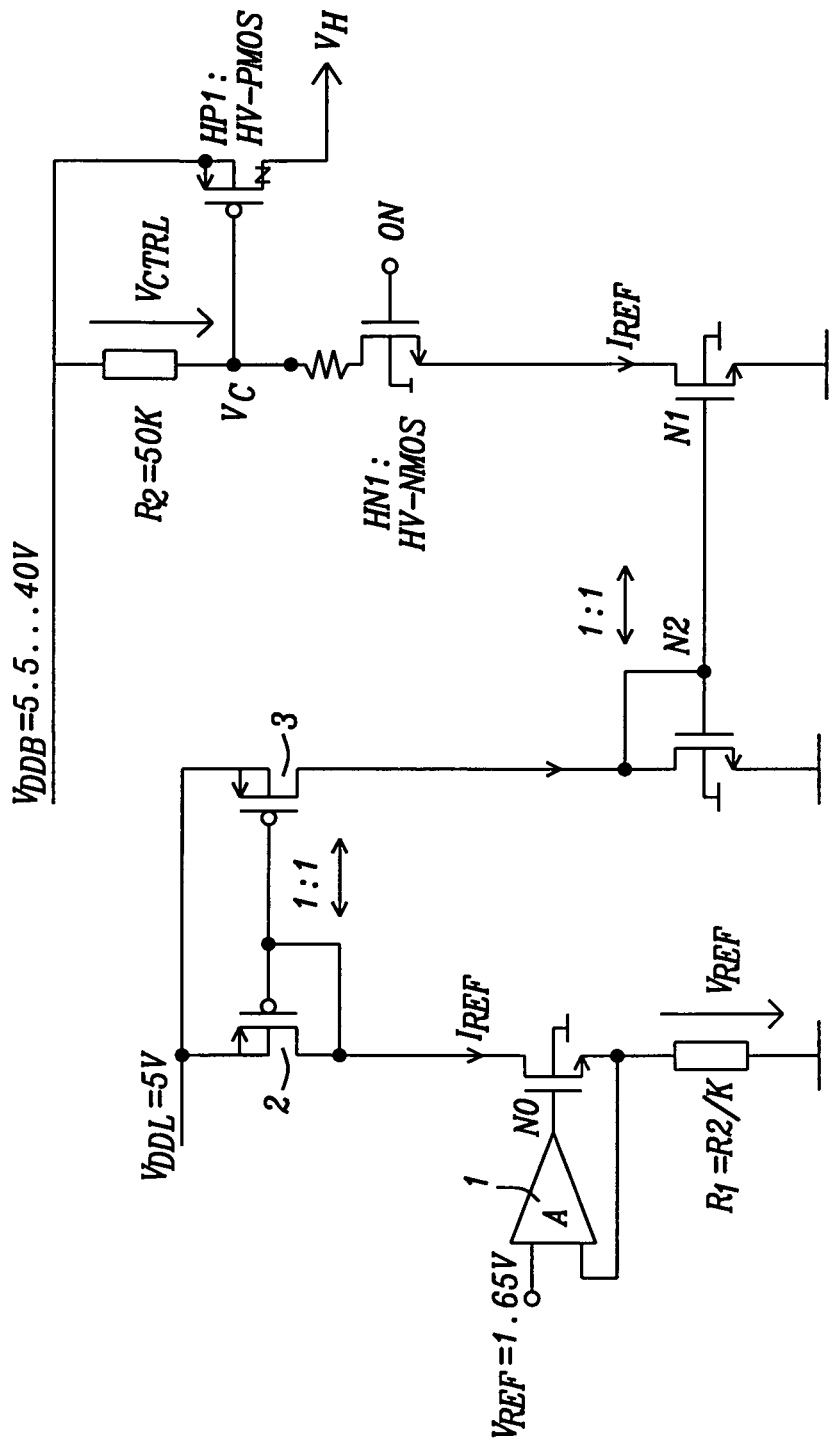
FIG. 1 shows a schematic of the principles of the invented circuit driving a HV P-MOS power transistor.

FIG. 1 shows principles of a preferred embodiment of the present invention, i.e. a schematic of a circuit driving a HV P-MOS power transistor (HP1). It should be noted that the invention could be applied to other power transistors with drain-source voltage capability higher than 5V and gate-source voltage limited to 5V.

The circuit shown in FIG. 1 to drive the HV P-MOS power transistor, HP1, is supplied directly by power supply, $V_{DDB}$, with an input comprised of HV N-MOS transistor, HN1, directly controlled by 5V digital signal. In the preferred embodiment the power supply voltage $V_{DDB}$ can vary between 5.5 V and 40 V. Other ranges of voltages are possible as well, depending on e.g. the type of high voltage power transistor used. The HV power transistors deployed have an extended drain region to reach up to 40 V drain source breakdown capability. As the source side of the High-Voltage CMOS devices is the same as it is for 5-V CMOS devices, its bulk-source voltage, Vbs, as well as its gate-source voltage, Vgs, are limited to 5V.

The input stage has a resistive load of R2 (e.g. 50 kΩ) that pulls the gate of HP1 to $V_{DDB}$, if the digital input signal ON is low (ON=0V). The resistive load, R2, together with the controlled input stage reference-current $I_{REF}$ serves as gate source limitation of $I_{REF}*R2$ when the digital input signal ON is high (ON=5V).

However the gate-source limitation of $I_{REF}*R2$ varies with current and resistor temperature/process changes, which needs to be cancelled. The circuit that cancels the variation uses an amplifier 1 to mirror a fixed voltage, $V_{REF}$, across a resistor R1, which is matched to that resistive load of R2 according to the equation R1=R2/K., wherein the factor K corresponds to the equation $K=V_{DDL}/V_{REF}$ or, according to the values of voltages used in the preferred embodiment illustrated in FIG. 1, K=5V/1.65V=3.03. It should be understood that these values are examples only and that other values of K and voltages could be applied as well. These values depend also on the types of high voltage transistors used.

The accurate matching of 5V MOS devices allows an accurate current ratio to be generated. Using the current ratios CM1=P3/P2=1 of the 5V P-MOS mirror, comprising P-MOS transistors 2 and 3 (P2 is the gate-drain connected P-MOS transistor) and CM2=N1/N2=1 of the 5V N-MOS mirror, comprising transistors N1 5 and N2 4, which is a gate-drain connected N-MOS transistor, an output current is generated, resulting in an accurate voltage limitation of $I_{REF}*R2=(V_{REF}/R1)*R2=K*V_{REF}=5V$. More generally formulated $K=V_{DDL}/V_{REF}$.

It should be noted that alternatively other current mirror ratios than 1:1 can be used as well, i.e. CM1 and CM2 result in an accurate voltage limitation of $I_{REF}*R2=(V_{REF}/R1)*CM1*CM2*R2=CM1*CM2*(R2/R1)*V_{REF}=V_{DDL}=5V$, and $K=V_{DDL}/V_{REF}=CM1*CM2*(R2/R1)$.

The HV-NMOS device HN1, also isolates the 5V-NMOS device N1, from the high voltage domain.

Figure 2:
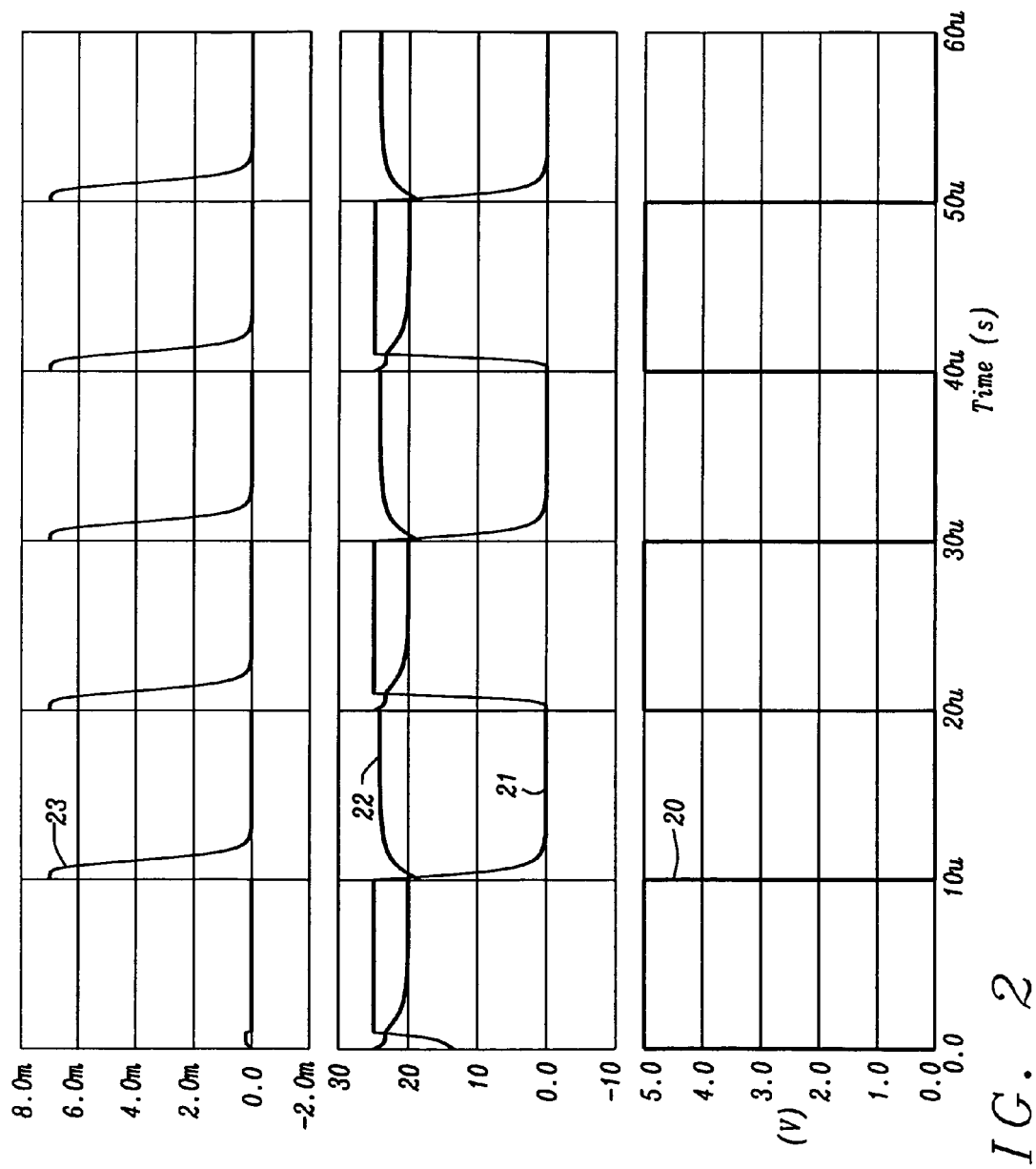
FIG. 2 depicts the transient response of the circuit of FIG. 1 with $V_{DDB}=25V$ and Cload=1 nF.

The output swing of the voltage $V_C$ at the gate of the HV P-MOS transistor HP1 is between $V_{DDB}$ and $V_{DDB}-5V$, and the output swing of voltage $V_H$ is between $V_{DDB}$ and 0V as shown in FIG. 2.

FIG. 2 illustrates the transient response of the circuit invented shown in FIG. 1 with voltage $V_{DDB}=25V$ and $C_{LOAD}=1$ nF. The load capacitance $C_{LOAD}$ is limited by the slew rate from the output swing of voltage $V_H$ of the HV P-MOS transistor HP1 as $$\tau_{LOAD}=R_{DSON\_HP1}*C_{LOAD}$$

for given requirement. The switching frequency is however only limited by the slew rate from the input swing of voltage $V_C$ of the HV P-MOS transistor HP1 as $\tau_1=R_2*C_{GS\_HP1}$ in FIG. 1.

Curve 20 shows the digital input signal ON. Curve 21 illustrates the drain voltage VH of the high voltage transistor HP1, curve 22 shows the voltage Vc at the gate of the high voltage transistor HP1, and curve 23 shows the power dissipation of the high voltage transistor HP1. Curve 23 shows the power dissipation in watt $(=|I_{CTRL}*(5V-V_C(t,\tau_1))|)$ to turn-on and turn-off of the HP1 in FIG. 1.

FIG. 2 demonstrates that the circuit invented provides a reliable solution to drive the HV P-MOS power transistor HP1 with accurate gate-source control voltage Vc 22. Furthermore FIG. 2 shows the power dissipation 23 of the power transistor HP1, the output voltage VH 22 responding to the digital input signal ON 20, which is driven with a frequency of 50 kHz. On the other hand, a rapid switchable on/off is expected to avoid drawing static power.

Because of the parasitic capacitance across the gate-source of the HP1 due to its large sizing (W×L=16,000×2.7), its control voltage Vc 22 changes with a time constant, $\tau_1=R2*C_{GS}\_HP1$, from $V_{DDB}$ to $V_{DDB}-5V$, as well as from $V_{DDB}-5V$ to $V_{DDB}$., wherein $C_{GS}$ is the gate-source capacitance of transistor HP1 This limits the switching speed and makes larger static power loss during on/off phases.

Figure 3:
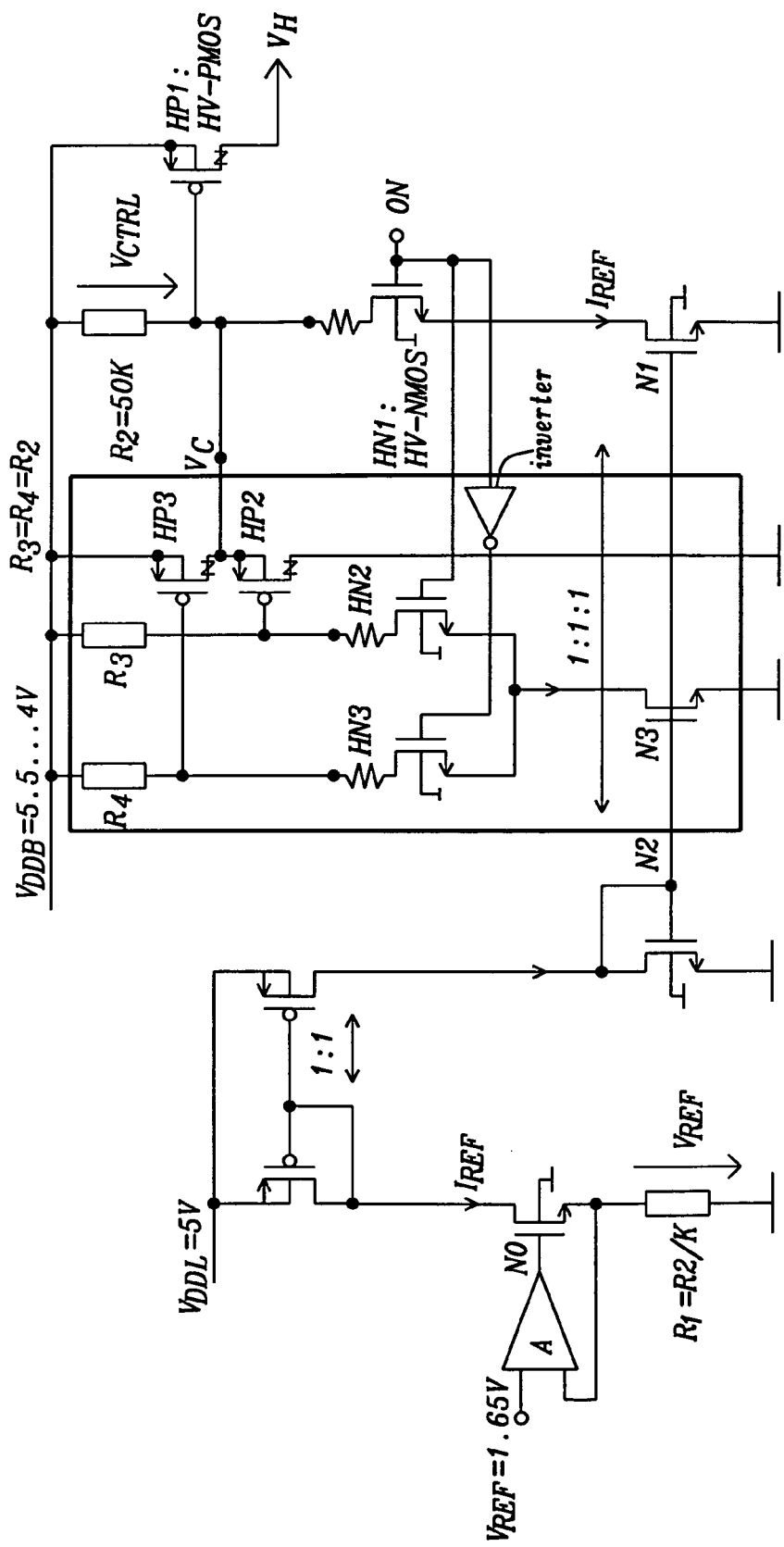
FIG. 3 shows a complete circuit for driving an HV-PMOS power transistor.

FIG. 3 shows a complete circuit for driving HV-PMOS power transistor HP1. In order to simultaneously have a rapid switching operation, a new circuit structure is proposed in FIG. 3. The highlighted control switches are added between the gate of HP1, $V_C$, and the power supply $V_{DDB}$. To make switching on/off faster, two smaller sizing HV P-MOS devices, HP2 and HP3 (e.g. having a size of =100×2.7), are added. The control circuit of HP2 and of HP3 are identical as of the HP1, but they share the reference current $I_{REF}$ and HP3 is controlled by an inverted 5V digital signal inverted by inverter 30. The resistors R3 and R4, each connecting a gate of HP3 or correspondently of HP4 with the supply voltage $V_{DDB}$, have the same resistance as resistor R2 connecting a gate of HP1 with the supply voltage $V_{DDB}$, as shown already in FIG. 1. In the following the operation of the circuit of FIG. 3 is described in two states, namely if the digital input signal ON is 5V and if the digital input signal ON is 0V.

When signal ON is 5V, the gate voltage of HP2 $V_{G\_}$HP2, charges from $V_{DDB}$ to $V_{DDB}$–5V. The source voltage of HP2 $V_{S\_}$HP2, which is above a diode threshold voltage higher than its gate voltage, charges from $V_{DDB}$ to $V_{DDB}$–$V_{G\_}$HP2+ $|V_{GS\_}$HP2$|$~$V_{DDB}$–5V+0.7V=$V_{DDB}$–4.3V having a time constant of $\tau_2$=R3*$C_{GS\_}$HP2. Therefore the control voltage, $V_C$, settles now from $V_{DDB}$ to $V_{DDB}$–4.3V with $\tau2$=R3*$C_{GS\_}$HP2, and then settles from $V_{DDB}$–4.3V to $V_{DDB}$–5V with time constant $\tau1$=R2*$C_{GS\_}$HP1. Since the parasitic capacitance at the gate of HP2 is much smaller than that at the gate of HP1 resulting time constant $\tau_2 \ll \tau_1$; thus a faster switching-on is achieved.

When signal ON is 0V and the inverted digital signal at the output of inverter 30 is 5V), the gate voltage of transistor HP3, $V_{G\_}$HP3, charges from $V_{DDB}$ to $V_{DDB}$–5V and closes its drain-source voltage with an on-resistance of $R_{DSON\_}$HP3 above 200Ω. Therefore the control voltage $V_C$ discharges now from $V_{DDB}$–5V to $V_{DDB}$ with $\tau_3$=$R_{DSON\_}$HP3*$C_{GS\_}$HP1 rather than with $\tau_1$=R2*$C_{GS\_}$HP1; thus a faster switching-off is achieved.

Figure 4:
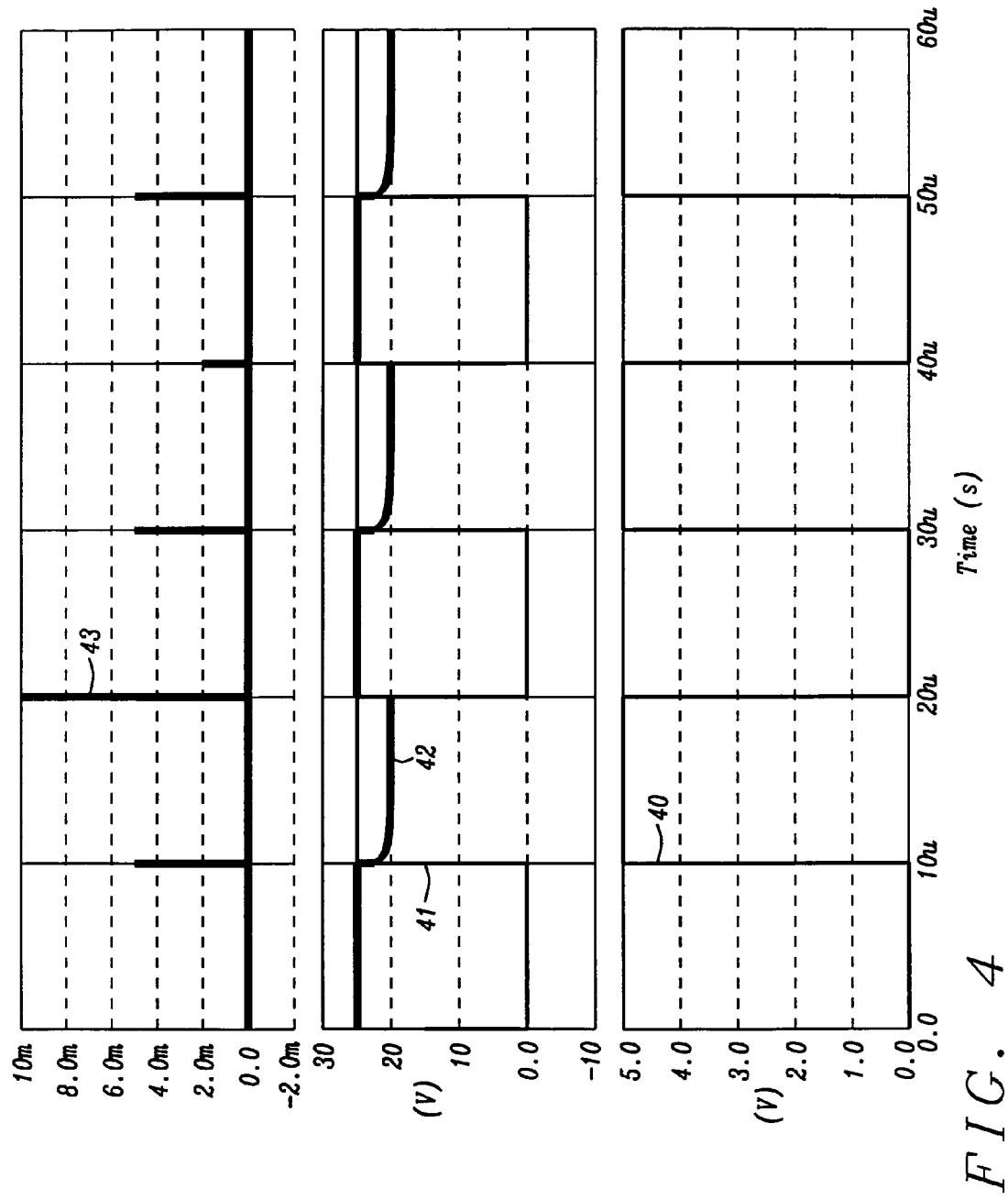
FIG. 4 shows the transient responses of the circuit of FIG. 3 with VDDB=25V, and Cload=1 nF, and operating frequency of 50 kHz.

FIG. 4 shows the transient responses of the circuit of FIG. 3 with supply voltage VDDB=25V, and Cload=1 nF. FIG. 4 demonstrates that the circuit of FIG. 3 provides a significant improved solution to drive the HV P-MOS power transistor HP1 compared to the circuit shown in FIG. 1. The digital input signal ON, shown in FIG. 4 is driven with the same frequency of 50 kHz as illustrated in the transient response charts of FIG. 2.

Comparing the response to the digital input signal ON 40 of the power dissipation 43 of the power transistor HP1, of the control voltage VC 42, and of the output voltage VH 42 shown in FIG. 4 with the correspondent curves of FIG. 2 it is clearly demonstrated that the circuit of FIG. 3 has less power dissipation and better time constants for $V_C$ and $V_H$ as outlined above.

Figure 5:
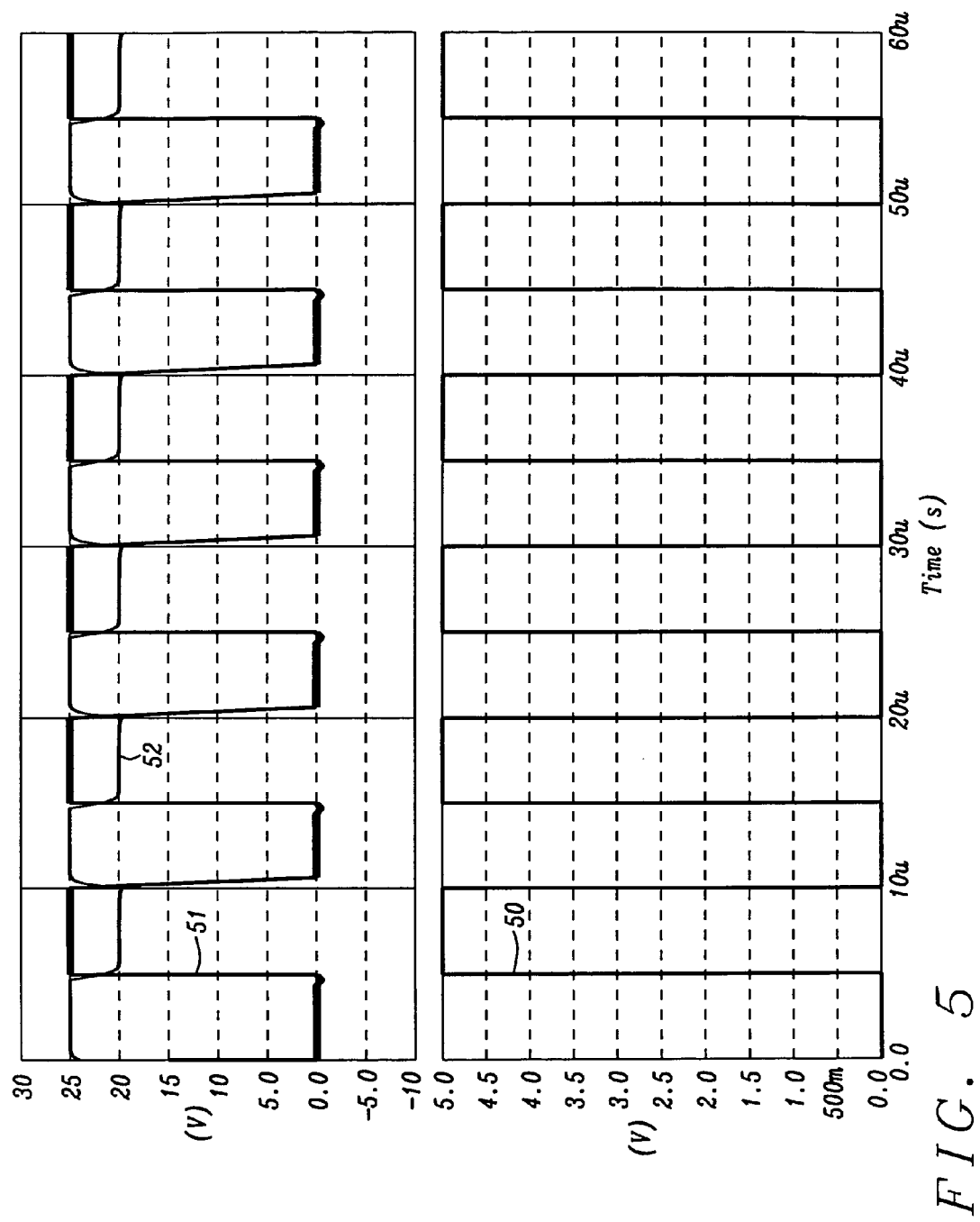
FIG. 5 shows the transient response of the circuit shown in FIG. 3 with VDDB=25V, and operating frequency of 1 MHz.

Turning to FIG. 5 now, the frequency of the digital input signal ON 50 of the circuit shown in FIG. 3 has been increased from 50 kHz to 1 MHz. FIG. 5 demonstrates that the circuit shown in FIG. 3 can be operated with a frequency of 1 MHz. Moreover the power dissipation of transistor HP1 has been further improved since the dissipation is only produced by the turn-on and turn-off of the transistor HP1, and is independent from the switching frequency as long as the switching period is larger than $t_{ON}$+$t_{OFF}$.

Figure 6:
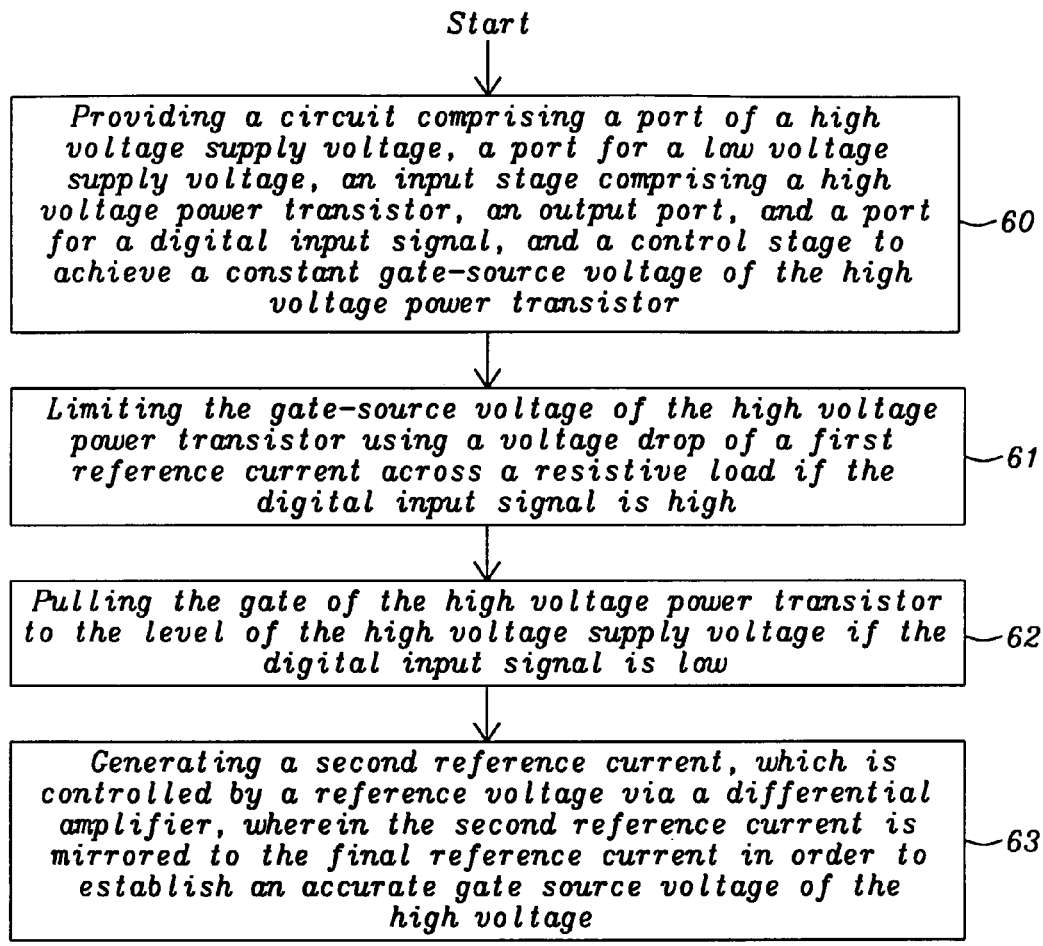
FIG. 6 illustrates a flowchart of a method invented to achieve a fast switchable high voltage power transistor driver circuit.

FIG. 6 illustrates a flowchart of a method invented to achieve a fast switchable high voltage power transistor driver circuit.

Step 60 of the method of FIG. 6 illustrates the provision of a circuit comprising a port for a high voltage supply voltage, a port for a low voltage supply voltage, an input stage comprising a high voltage power transistor, an output port, and a port for a digital input signal, and a control stage to achieve a constant gate-source voltage of the high voltage power transistor. Step 61 limiting the gate-source voltage of the high voltage power transistor using a voltage drop of a first reference current across a resistive load if the digital input signal is high. Step 62 describes pulling the gate of the high voltage power transistor to the level of the high voltage supply voltage if the digital input signal is low and step 63 teaches generating a second reference current, which is controlled by a reference voltage via a differential amplifier, wherein the second reference current is mirrored to the first reference current in order to establish an accurate gate source voltage of the high voltage.

While the invention has been particularly shown and described with reference to the preferred embodiments thereof, it will be understood by those skilled in the art that various changes in form and details may be made without departing from the spirit and scope of the invention.

What is claimed is:

1. A method to achieve a fast switchable high voltage power transistor driver circuit, comprising the following steps:
   (1) providing a circuit comprising a port for a high voltage supply voltage, a port for a low voltage supply voltage, an input stage comprising only one high voltage output power transistor, an output port, and a port for a digital input signal, and a control stage to achieve a constant gate-source voltage of the only one high voltage output power transistor;
   (2) limiting the gate-source voltage of the high voltage output power transistor using a voltage drop of a first reference current across a resistive load if the digital input signal is high, wherein time constants for switching on and off the high voltage output power transistor are reduced by adding two high voltage transistors of the same type as the high voltage output power transistor to the circuit in parallel to the input stage in order to increase the operation frequency of the circuit, wherein each of both additional transistors is smaller than the high voltage power transistor;
   (3) pulling the gate of the high voltage power transistor to the level of the high voltage supply voltage if the digital input signal is low; and
   (4) generating a second reference current, which is controlled by a reference voltage via a differential amplifier, wherein the second reference current is mirrored to the first reference current in order to establish an accurate gate source voltage of the high voltage.

2. The method of claim 1 wherein the high voltage supply voltage can vary between a voltage in the order of magnitude of about 5.5 Volts and a voltage in the order of magnitude of about 40 Volts.

3. The method of claim 1 wherein the low voltage supply voltage is in the order of magnitude of about 5 Volts.

4. The method of claim 1 wherein the high voltage power transistor can be any power transistor with drain-source voltage capability higher than 5V and gate-source voltage limited to 5V.

5. The method of claim 1 wherein the high voltage power transistor is a high voltage P-MOS transistor.

6. The method of claim 5 wherein the high voltage P-MOS transistor has an extended drain region.

7. The method of claim 1 wherein the port for the digital input signal is a gate of a high voltage N-MOS transistor.

8. The method of claim 7 wherein the high voltage N-MOS transistor has an extended drain region.

9. The method of claim 7 wherein the high voltage N-MOS transistor isolates a low voltage transistor, used for mirroring the first reference current to the second reference current, from a high voltage domain.

10. The method of claim 1 wherein said resistive load has a resistance in the order of magnitude of about 50 KOhms.

11. The method of claim 1 wherein the second reference current is generated by mirroring a fixed reference voltage by said amplifier a cross a resistive means, which is matched to the resistive load.

12. The method of claim 11 wherein the second reference is mirrored to the first reference current via two current mirrors wherein both current mirrors comprise low voltage transistors.

13. The method of claim 1 wherein generation of the second reference current and the mirroring to the first reference current is performed in a low voltage region.

14. The method of claim 1 wherein the swing of the output port is from the high voltage supply voltage to 0 Volts.

15. The method of claim 1 wherein the swing of the gate of the high voltage power transistor is from the high voltage supply voltage-allowable gate source voltage.

16. The method of claim 1 wherein both control circuits of each of said additional high voltage transistors are identical to the control circuit of the high voltage power transistor but they share one reference current and a second transistor of these two additional high voltage transistors is controlled by an inverted signal.

17. The method of claim 1 wherein said second reference current is mirrored to the first reference current with a ratio of 1:1.

18. The method of claim 1 wherein said second reference current can be mirrored to the first reference current with any suitable ratio.

19. A fast switchable high voltage power transistor driver circuit comprising:
   an input stage comprising:
      a port for a high voltage supply voltage;
      a port for a digital input signal;
      one single high voltage power transistor connected between said high voltage supply port and an output port of the circuit;
      a resistive load connected between a gate of the high voltage power transistor and the high voltage supply port;
      a high voltage transistor being connected between the gate of the high voltage power transistor and a low voltage transistor; and
      said low voltage transistor connected between the high voltage transistor and ground wherein the gate of the low voltage transistor is connected to a control stage; and
   the control stage, supplied by a low supply voltage, configured to cancel temperature and process variations by mirroring a first reference current to a current flowing through the resistive load, wherein the first reference current is generated by a fixed reference voltage across a first resistive means that is matched to the resistive load, wherein all devices of the control stage are matched;
   wherein time constants for switching on and off the high voltage power transistor are reduced by adding two hiqh voltage transistors of the same type as the high voltage power transistor to the circuit in parallel to the input stage in order to increase the operation frequency of the circuit, wherein each of both additional transistors is smaller than the high voltage power transistor.

20. The driver circuit of claim 19 wherein the high voltage supply voltage can vary between a voltage in the order of magnitude of about 5.5 Volts and a voltage in the order of magnitude of about 40 Volts.

21. The driver circuit of claim 19 wherein the low voltage supply voltage is in the order of magnitude of about 5 Volts.

22. The driver circuit of claim 19 wherein the high voltage power transistor is a high voltage P-MOS transistor.

23. The driver circuit of claim 22 wherein the high voltage P-MOS transistor power has an extended drain region.

24. The driver circuit of claim 19 wherein the high voltage transistor is a high voltage NMOS transistor.

25. The driver circuit of claim 24 wherein the high voltage N-MOS transistor has an extended drain region.

26. The driver circuit of claim 24 wherein the port for the digital input signal is a gate of the high voltage N-MOS transistor.

27. The driver circuit of claim 19 wherein the high voltage N-MOS transistor isolates a low voltage transistor, used for mirroring the first reference current to the second reference current, from a high voltage domain.

28. The driver circuit of claim 19 wherein said resistive load has a resistance in the order of magnitude of about 50 KOhms.

29. The driver circuit of claim 19 wherein said first current mirror has a scale of 1:1.

30. The driver circuit of claim 19 wherein said second current mirror has a scale of 1:1.

31. The driver circuit of claim 19 wherein said first resistive means has a resistance R according to the equation R=resistance of the resistive load divided by a factor K, wherein K=low supply voltage divided by said reference voltage.

32. The driver circuit of claim 19 wherein the swing of the output port is from the high voltage supply voltage to 0 Volts.

33. The driver circuit of claim 19 wherein the swing of the gate of the high voltage power transistor is from the high voltage supply voltage-allowable gate source voltage.

34. The driver circuit of claim 19 wherein both control circuits of each of these additional high voltage transistors are identical to the control circuit of the high voltage power transistor but they share one reference current and a second transistor of these two additional high voltage transistors is controlled by an inverted signal.

35. The driver circuit of claim 19 wherein a circuitry to connect these additional transistors comprises:
   a first of said two additional high voltage transistors being connected between the high voltage supply voltage and the gate of the high voltage power transistor, wherein its gate is connected via a second resistive means to the high supply voltage and to a drain of a third additional high voltage transistor;
   a second of said two additional high voltage transistors being connected between the gate of the high voltage power transistor and ground, wherein its gate is connected via a third resistive means to the high supply voltage and to a drain of a fourth additional high voltage transistor;
   said second resistive means;
   said third resistive means;
   said third additional high voltage transistor having its source connected to a source of the fourth additional high voltage transistor and to a drain of a fifth low voltage transistor and its gate is connected to an output of an inverter;
   said fourth additional high voltage transistor having its gate connected to the port for a digital input signal;
   said inverter having its input connected to the port for a digital input signal; and
   said fifth low voltage transistor having its source connected to ground and its gate is connected to the gates of said second current mirror.

36. The driver circuit of claim 35 wherein said second and said third resistive means have a same resistance as said resistive load.

37. The driver circuit of claim 35 wherein each of said first and second additional high voltage transistors are P-MOS transistors and each of both transistors are smaller than the high voltage power transistor.

38. The driver circuit of claim 35 wherein each of said third and fourth additional high voltage transistors are NMOS transistors.

39. The driver circuit of claim 35 wherein said fifth low voltage transistor is a NMOS transistor.

40. The driver circuit of claim 19 wherein said first reference current is mirrored via a second reference current to the current following through the resistive load.

41. The driver circuit of claim 19 wherein the control stage comprises:

a port of a low voltage supply voltage;

a differential amplifier having inputs and an output, wherein a first input is connected to a port of a reference voltage, a second input is a voltage of a first terminal of a first means of resistance, and the output is connected to a gate of a first transistor;

said first means of resistance, wherein the first terminal is connected to the first transistor and a second terminal is connected to ground;

said first transistor connected between said means of resistance and a second transistor;

said second transistor connected between said first transistor and the port for low supply voltage, wherein the second transistor is forming a first current mirror with a third transistor;

said third transistor connected between the port for the low voltage supply voltage and the fourth transistor; and said fourth transistor connected between the third transistor and ground, wherein the fourth transistor is forming a second current mirror with said low voltage transistor of the input stage.

* * * * *